(12) United States Patent
Renlund et al.

(10) Patent No.: US 6,587,485 B1
(45) Date of Patent: Jul. 1, 2003

(54) METHOD OF CHARACTERISING A TUNEABLE LASER AND DETERMINING ACTUAL WAVELENGTH

(75) Inventors: Markus Renlund, Stockholm (SE); Lars Andersson, Järfälla (SE)

(73) Assignee: Altitun, AB, Jarfalla (SE)

( * ) Notice: Subject to any disclaimer, the term of this patent is extended or adjusted under 35 U.S.C. 154(b) by 0 days.

(21) Appl. No.: 09/913,847
(22) PCT Filed: Feb. 15, 2000
(86) PCT No.: PCT/SE00/00294
§ 371 (c)(1), (2), (4) Date: Jan. 2, 2002
(87) PCT Pub. No.: WO00/54381
PCT Pub. Date: Sep. 14, 2000

(30) Foreign Application Priority Data

Feb. 17, 1999 (SE) ............................................. 9900536
Aug. 27, 1999 (SE) ............................................. 9903039

(51) Int. Cl.[7] ............................................. H01S 3/10
(52) U.S. Cl. ............................................. 372/20; 372/32
(58) Field of Search ............................................. 372/29.015, 20, 372/32, 38.07, 38.02; 356/326, 477, 328, 345, 352, 349

(56) References Cited

U.S. PATENT DOCUMENTS

| | | | | |
|---|---|---|---|---|
| 4,792,956 A | | 12/1988 | Kamin | 372/29 |
| 5,019,769 A | * | 5/1991 | Levinson | 372/31 |
| 5,383,208 A | * | 1/1995 | Queniat et al. | 372/29.014 |
| 5,812,572 A | * | 9/1998 | King et al. | 372/38.04 |
| 6,097,487 A | * | 8/2000 | Kringlebotn et al. | 356/450 |
| 6,163,555 A | * | 12/2000 | Siddiqui et al. | 372/32 |
| 6,373,568 B1 | * | 4/2002 | Miller et al. | 356/326 |
| 6,504,856 B1 | * | 1/2003 | Broberg et al. | 372/38.07 |
| 2002/0001080 A1 | * | 1/2002 | Miller et al. | 356/326 |
| 2002/0149780 A1 | * | 10/2002 | Trinh | 356/477 |
| 2003/0030801 A1 | * | 2/2003 | Levenson et al. | 356/326 |

FOREIGN PATENT DOCUMENTS

| | | |
|---|---|---|
| EP | 0 529 732 | 3/1993 |
| EP | 0 774 684 | 5/1997 |
| GB | 2163286 | 2/1986 |

OTHER PUBLICATIONS

Optical Fiber Communication Conference, 1999, OFC/IOOC '99, Technical Digest, 1999 (21–26/2) San Diego, vol. 2, pp. 137–139.

* cited by examiner

Primary Examiner—Paul Ip
Assistant Examiner—Jeffrey Zahn
(74) Attorney, Agent, or Firm—Altera Law Group, LLC

(57) ABSTRACT

A method of evaluating a tuneable laser and determining suitable laser operation points, wherein the laser includes one or more tuneable sections in which injected current can be varied. A portion of the laser light output is divided into parallel paths, one part of which passes through a periodic filter, a second part of which is unfiltered, and a third part of which passes through a monotonic filter. The light power outputs from the respective paths are compared as sweep currents are injected into the tuning sections of the laser. When the ratios of the power outputs are within a predetermined range the tuning current combinations for those operating points are stored.

8 Claims, 2 Drawing Sheets

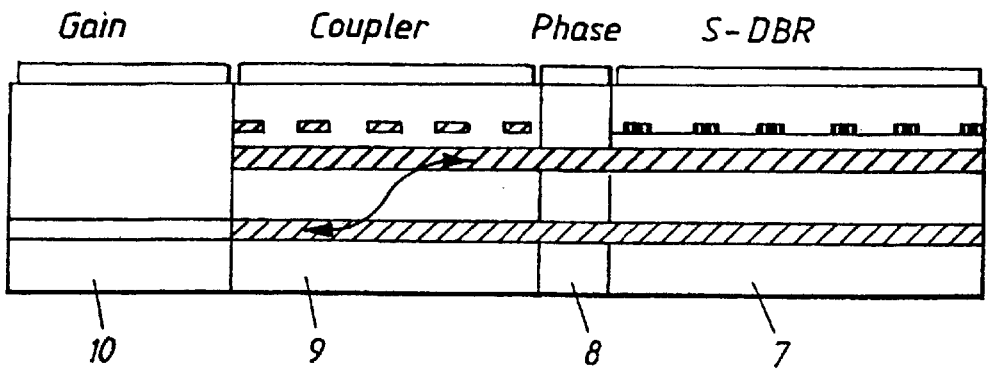
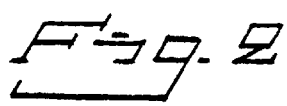
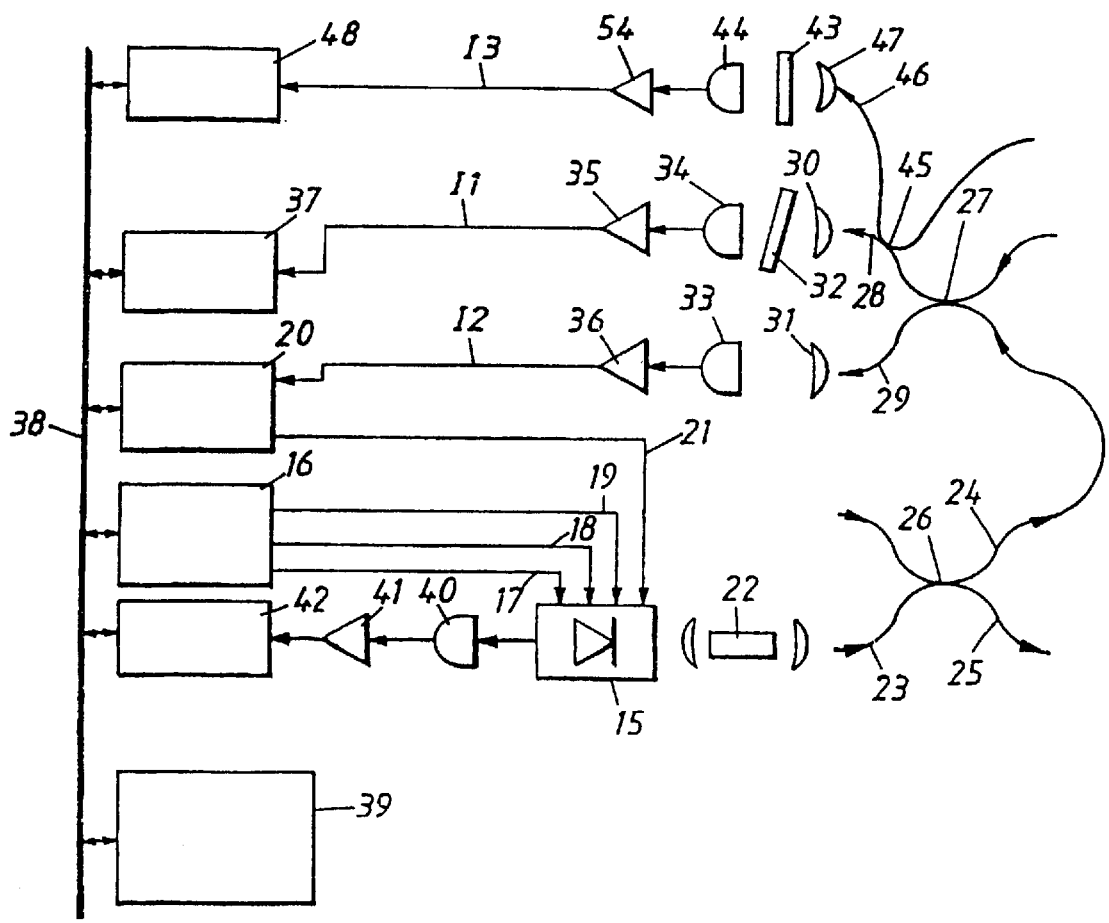

METHOD OF CHARACTERISING A TUNEABLE LASER AND DETERMINING ACTUAL WAVELENGTH

The present invention relates to a method for rapidly characterising a tuneable laser.

The method can be applied to evaluate and select lasers with respect to emitted wavelengths, and to systematically find good operation points.

Tuneable semiconductor lasers include several sections to which current is injected, these sections typically being three or four in number. The wavelength, power and mode purity of the lasers can be controlled by regulating the current injected into the various sections. Mode purity implies that the laser is at an operation point, i.e. at a distance from a combination of the drive currents where so-called mode jumps take place and where lasering is stable and sidemode suppression is high.

In the case of telecommunications applications, it is necessary that the laser is able to retain its wavelength to a very high degree of accuracy and over long periods of time, after having set the drive currents and the temperature. A typical accuracy in this respect is 0.1 nanometer and a typical time period is 20 years.

In order to be able to control the laser, it is necessary to map the behaviour of the laser as a function of the various drive currents. This is necessary prior to using the laser after its manufacture.

One problem is that lasers exhibit an hysteresis. This means that for a given drive current set-up, i.e. a given operation point, the laser will deliver different output signals with respect to power and wavelength depending on the path through which the laser has passed with respect to the change in said drive currents in order to arrive at the operation point in question. Thus, a given drive current set-up will not unequivocally give the expected wavelengths or power in this case.

In the case of a tuneable laser, the wavelength of the light emitted is determined mainly by the current through or the voltage across the tuning sections. The power output is controlled by current to the gain section of the laser or by the voltage across said section.

All possible control combinations afforded by the tuning sections, or a subset of said sections, are investigated when characterising a laser. During the characterising process, the light emitted is studied with respect to wavelength and sidemode suppression and in controlling the gain section with regard to power adjustment.

The large number of possible control combinations, typically tens of billions, of which fewer than a hundred shall be selected, makes total mapping of the laser impossible in view of the large amount of data generated.

One method of characterising a laser is described in Swedish Patent No. 9900536-5. According to this patent publication, the hysteresis of the laser is also considered. The patent relates to a method of quickly sorting out control combinations that do not result in correct wavelengths.

The aforesaid patent relates to a method of evaluating a tuneable laser and of determining suitable operation points for a laser that includes two or more tuneable sections in which injected current can be varied and of which at least one is a reflector section and one is a phase section. According to the patent, part of the light emitted by the laser is led to an arrangement that includes a Fabry-Perot filter and a first and a second detector, said detectors being adapted to measure the power of the light and to deliver a corresponding detector signal. The detectors are arranged relative to the Fabry-Perot filter such that the detector signals will contain information relating at least to the wavelength of the detected light from a number of wavelengths given by the filter. The currents through the tuning sections are swept so as to pass through different current combinations, the ratio between the two detector signals being measured during said sweeps. The current combination is stored when the ratio between the detector signals lies within a predetermined range that indicates that the light emitted lies within one of a number of wavelengths given by the Fabry-Perot filter.

The Fabry-Perot filter is adapted to have a certain given transmission for those wavelengths included in a so-called channel plan where each channel corresponds to a well-defined wavelength.

One problem with the invention according to the aforesaid prior patent publication is that no information is obtained as to which operation point belongs to which channel. It is therefore necessary to determine and sort the various operation points, which must be done manually and with conventional instruments.

This problem is solved by the present invention.

The present invention thus relates to a method of evaluating a tuneable laser and determining suitable laser operation points, wherein the laser includes one or more tuneable sections in which injected current can be varied, and wherein the invention is characterised by leading part of the light emitted by the laser to an arrangement that includes a first filter in the form of a periodic filter that gives rise to a signal which varies periodically with wavelength, such as a Fabry-Perot filter, and a first and a second detector which are adapted to measure the power of the light and to emit a corresponding detector signal; in that the detectors are arranged relative to the periodic filter such that said detector signals will include information relating to at least the wavelength of the detected light from a plurality of wavelengths given by the filter; in that the second filter is disposed parallel with the periodic filter and comprises a filter whose response varies monotonically with the wavelength, wherein the light transmitted through the second filter is led to a third detector which emits a detector signal corresponding to the power of the light and therewith wavelength; in that the currents through the tuning sections are swept so as to pass through different current combinations; in that the ratio between the two detector signals is measured during each sweep; in that when the ratio between the detector signals lies within a predetermined range indicating that the light emitted lies within one of a number of the wavelengths given by the periodic filter, the third detector is caused to detect so as to sort out the wavelength concerned; and in that the control combination of said tuning currents is stored together with the wavelength concerned.

The invention will now be described in more detail partly with reference to exemplifying embodiments thereof shown on the accompanying drawings, in which FIG. 1 is a sectional view of a tuneable Grating Coupled Sampled Reflector (GCSR) laser;

FIG. 2 is a schematic block diagram illustrating an arrangement used in accordance with the invention;

Figure 3:
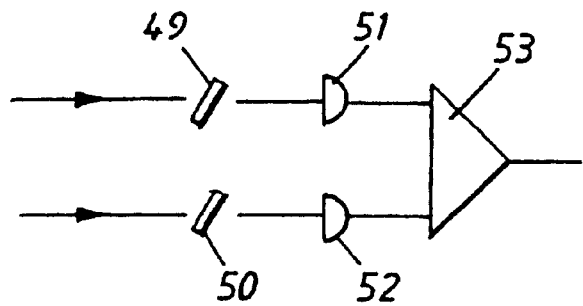
FIG. 3 illustrates a monotonic filter.

A DBR laser includes three sections, namely a Bragg reflector 1, a phase section 2 and a gain section 3. Each section is controlled by injecting current into respective sections.

FIG. 1 is a sectional view of a tuneable Grating Coupled Sampled Reflector (GCSR) laser. Such a laser includes four sections, namely a Bragg reflector 7, a phase section 8, a coupler 9 and a gain section 10. Each of the sections is controlled by injecting current into respective sections.

A DBR laser includes three sections, namely a Bragg reflector 1, a phase section 2 and a gain section 3. Each section is controlled by injecting current into respective sections.

A Sampled Grating DBR laser also has four sections of which the outer sections are Bragg reflectors and where a phase section and a gain section are situated therebetween.

These three laser types are common, although other types of lasers exist.

Although the invention is described below essentially with reference to a GCSR laser according to FIG. 1, it will be understood that the invention is not restricted to any particular type of tuneable semiconductor laser but can be applied correspondingly with tuneable lasers other than those described.

The present invention relates to a method of evaluating tuneable lasers and determining suitable laser operation points. The laser may thus include one or more tuneable sections in which injected current can be varied in a known manner. The laser may be of the kind that includes at least one reflector section and one phase section. The laser may also be of the kind that includes only one tuning section, or of the kind with which the laser is tuned by some mechanism other than current injection in a reflector.

FIG. 2 is a block diagram illustrating an arrangement used in accordance with the invention. The reference numeral 15 identifies a GCSR laser, while the reference numeral 16 identifies current generators for injecting current into the reflector section of the laser, phase section and coupler section respectively through a respective conductor 17, 18 and 19. The power of the laser is controlled by means of a power regulating circuit 20 via a conductor 21 leading to the laser gain section.

The laser emits light from the front mirror to a light conductor 23, for instance a light fibre, via a lens pack 22. This light conductor leads the light to a light splitter or divider 26 which switches part of the light to a second light conductor 24. The remainder of the light is led further in the conductor 25. The light splitter 26 switches, e.g., 10% of the light from the conductor 23 to the conductor 24.

The light conductor 24 leads the light to a second light splitter or divider 27 that functions to divide the light equally between two conductors 28, 29. A lens 30 and a lens 31 are disposed at respective ends of the light conductors. A Fabry-Perot filter 32 or some corresponding periodic filter is provided in the beam path downstream of the lens 30. The filter 32 is well known in the art and will not therefore be described in any great detail in this document. Fabry-Perot filters can be designed to exhibit a certain light transmission solely for certain wavelengths, normally wavelengths that are multiples of a given wavelength. The Fabry-Perot filter exhibits a deviating lower or higher transmission at other wavelengths. It will be understood that other periodic filters that have properties corresponding to those of a Fabry-Perot filter may be used instead.

Figure 4:
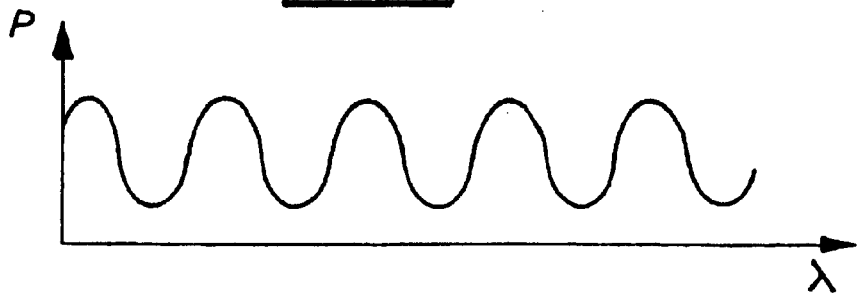
FIG. 4 shows laser power as a function of the wavelength for a periodic filter.

FIG. 4 illustrates schematically power downstream of the periodic filter as a function of wavelength.

A first detector 33 is provided downstream of the lens 31, and a second detector 34 is provided downstream of the Fabry-Perot filter. The detectors 33, 34 function to measure the power of the light and to send a corresponding detector signal to an A/D converter 37 via a respective amplifier 35, 36.

The A/D converter 37, the power regulating circuit 20 and the current generators 16 are all connected to microprocessor 39 via a data bus 38. The microprocessor is adapted to control the current generators and the power regulating circuit in a desired and well-known manner, in response to the signals from the A/D converter 37 and the power regulating circuit 20.

Part of the forwardly emitted light is conducted to the first detector 33 and also to the second detector 34 via the Fabry-Perot filter 32.

The currents are swept through the tuning sections 18, 19, 21 such as to pass through different current combinations. The ratio between the two detector signals I1 and I2 is measured during said sweeps.

When sweeping the currents through the tuning sections, the reflector current is the inner sweep variable. This means that the reflector current is swept for different combinations of other tuning currents while holding said currents constant. The reflector current is swept first in one direction and then in the opposite direction, back to its start value. For instance, the reflector current is swept from a zero value and up to its maximum value and then back down to zero.

By current control in the present document is meant that the current through the sections is controlled by current generators or, alternatively, that the current through the section is controlled by controlling the voltage across said sections.

In the case of the FIG. 2 embodiment, the first detector, the second detector and the Fabry-Perot filter are placed in the proximity of the front mirror of the laser. Alternatively, these components may equally as well be placed in the proximity of the rear mirror of the laser, in which case light emitted from the laser rear mirror is used to determine the wavelength.

Furthermore, the Fabry-Perot filter and the first and the second detectors may be arranged relative to one another in a manner different to that shown in FIG. 4, so as to detect at least wavelengths. The first detector and the second detector may be adapted to measure light transmitted through the Fabry-Perot filter and/or light reflected towards the Fabry-Perot filter, such as to detect wavelengths.

Those operation points that lie in the regions of hysteresis with respect to the reflector current or with respect to other tuning currents for those sections that exhibit hysteresis are non-preferred operation points for a laser in operation.

Communication lasers shall be adapted to operate at certain given wavelengths that are included in a so-called channel plan, where each channel corresponds to a well-defined wavelength. According to the invention, the Fabry-Perot filter 32 is adapted to have a certain given transmission for each wavelength included in the channel plan.

When the ratio between the detector signals I1/I2 from the detectors 32, 33 lies within a predetermined range implying that the light emitted lies within one of a number of wavelengths given by the Fabry-Perot filter and said ratio I1/I2 lies within said range for a given reflector current in both sweep directions of said current, the tuning current control combination is stored.

This range is given by the permitted channel width in the channel plan.

These control combinations thus fulfil the criteria that will result in desired wavelength and not in any hysteresis effect.

In certain cases, it is preferred that one or more other section tuning currents that exhibit an hysteresis effect, excluding the reflector current, are swept so as to determine whether or not hysteresis occurs in a contemplated operation point.

The aforesaid is also apparent from the above-mentioned patent publication.

Figure 5:
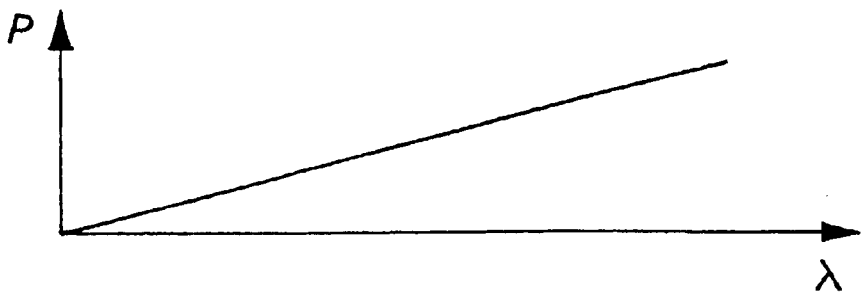
FIG. 5 shows laser power as a function of the wavelength of a monotonically varying filter.

According to the present invention, a second filter 43 is arranged parallel with the periodic filter 32. Half the light power in the light conductor 28 upstream of the lens 30 is suitably switched by a light splitter 45 to a light conductor 46 that conducts the light to the third filter 43 via a lens 47. The second filter 43 is a filter whose response varies monotonically with the wavelength. This is illustrated in FIG. 5, where the transmitted power P is shown to vary monotonically with the wavelength. The light transmitted through the second filter is led to a third detector 44 which, via an amplifier 54, sends to an A/D converter 48 a detector signal I3 corresponding to the power of the light and therewith its wavelength. The A/D converter is connected to said data bus 38.

FIG. 3 illustrates an example of a known monotonically varying filter. The filter is a dielectric wavelength-selective filter. The light is divided up upstream of the filter and each part of the light is led through glass 49, 50 on which a thin layer has been vaporised. After transmissions through the glass, the power is detected by means of detectors 51, 52 and the output signals of respective detectors are passed to an operational amplifier 53 whose output signal is a measurement of the wavelength.

Another example of the second filter is implementation of the wavelength selectivity of a light splitter in the form of a fibre coupler.

As before mentioned, the currents are swept through the tuning sections 17, 18, 1 and the ratio between the two detector signals I1, I2 is measured during the sweep. When the ratio between the detector signals (I1, I2) lies within a predetermined range implying that the light emitted lies within one of a number of the wavelengths given by the periodic filter 32, the third detector 44 is caused to detect so as to sort-out the wavelength concerned. The tuning current control combination is herewith stored together with the wavelength concerned.

To this end, I1, I2 and I3 are conducted to the microprocessor via the data bus, said processor being adapted to evaluate operation points and wavelengths and to store the same. The microprocessor is later used to control the laser to operate at a desired wavelength.

The signal from the third filter thus provides a clear measurement of the wavelength of the laser. However, the accuracy of this measurement is not sufficient on its own to evaluate the different operation points of the laser, although it is sufficient to identify positively each peak in the periodic filter. Thus, it is possible to determine all operation points that give the desired wavelengths.

The invention thus enables the laser to be characterised by very rapid measurements of the optical power that passes the two filters and to determine automatically the laser operation points for all desired channels in the channel plan.

According to one preferred embodiment of the invention, the signal I2 from the first detector 33 is delivered to the power regulating circuit 20. This circuit is adapted to control the laser to emit light with a constant output power. This enables the ratio I1/I2 to be easily followed in determining possible operation points.

According to another preferred embodiment, a monitor diode is placed on the side of the laser opposite to the side on which the first and the second detectors are placed, said monitor diode being caused to measure the light emitted by the laser. The signal from the detector 40 is passed via an amplifier 41 to an A/D converter 42 whose output signal is sent to the microprocessor 39. According to this embodiment, one or more tuning currents are chosen such as to minimise the ratio between the power of the rearwardly emitted light and the power of the forwardly emitted light, whereby there is chosen an optimal operation point from said possible operation points in respect of a channel.

It will be understood that the aforedescribed use of a Fabry-Perot filter enables all those control combinations that do not fulfil the criterion of requiring the ratio between the currents I1/I2 to lie within a certain given interval to be sorted out.

Furthermore, for communications purposes it suffices to identify one control combination per wavelength in the channel plan that lies in a range in which the laser does not exhibit hysteresis.

The present invention thus solves the problem mentioned in the introduction.

Although the invention has been described with reference to various exemplifying embodiments thereof and in conjunction with a GCSR laser, it will be understood that the structural design of the described arrangement can be varied whilst achieving the same result. It will also be understood that the invention can be applied with lasers other than GCSR lasers.

The present invention is therefore not restricted to the aforedescribed embodiments thereof, since variations and modifications can be made within the scope of the following claims.

What is claimed is:

1. A method of evaluating a tuneable laser and determining suitable laser operation points, wherein the laser includes one or more tuneable sections in which injected current can be varied, said method comprising the steps of: leading part of light emitted by the laser to an arrangement that includes a first, periodic filter that provides a first signal that varies periodically with wavelength, a first detector to measure the power of the light from the periodic filter and to deliver a corresponding first detector signal, and a second detector to measure the power of unfiltered laser light and to deliver a corresponding second detector signal; arranging the detectors relative to the periodic filter so that the detector signals contain information relating at least to the wavelength of the detected light from a number of wavelengths given by the periodic filter; arranging a second filter parallel with the periodic filter, wherein said second filter is a filter whose response varies monotonically with the wavelength; leading light transmitted through the second filter to a third detector which delivers a third detector signal corresponding to the power of the light and also the wavelength; sweeping currents through the tuneable sections of the laser to pass through different tuning current combinations; measuring the ratio between the first and second detector signals during said sweep; controlling the third detector to sort out a relevant wavelength when the ratio between the first and second detector signals lies within a predetermined range and therewith signifies that the emitted light lies within one of a number of wavelengths given by the periodic filter; and storing the tuning current combination together with the sorted wavelength concerned.

2. A method according to claim 1, wherein during the sweep of the currents through the tuneable sections to pass through different tuning current combinations, the reflector current is an inner sweep variable which is swept in one direction and then in an opposite direction back to its start value; and storing the tuning current combination and wavelength when said ratio lies within said predetermined range for a given reflector current in both sweep directions of said current.

3. A method according to claim 1, wherein the periodic filter has a given transmission for each wavelength included in a channel plane that includes desired wavelengths, and has a transmission which deviates therefrom in respect of other wavelengths.

4. A method according to claim 1, including the step of: delivering signal from the second detector positioned adjacent a front mirror of the laser to a power regulating circuit to control the laser to emit light with a constant output power from the front mirror.

5. A method according to claim 1, including the steps of: providing a monitor diode on a side of the laser opposite to that side on which the first and the second detectors are placed, to measure the light emitted by the laser; and adjusting at least one of the tuning currents to minimize the ratio between the power of rearwardly emitted light and the power of forwardly emitted light to optimize an operation point for the laser.

6. A method according to claim 1, including the step of: sweeping at least one non-reflector tuning current applied to a tuneable section that exhibits a hysteresis effect, to determine whether hysteresis occurs at a contemplated operation point.

7. A method according to claim 1, including the steps of: measuring the wavelength transmitted by the laser at a number of possible operation points taken out until one operation point has been obtained for each desired wavelength, and storing the tuning current combination for each such operation point.

8. A method according to claim 1, wherein the periodic filter is a Fabry-Perot filter.

* * * * *